United States Patent
Hsu (10) Patent No.: US 10,665,638 B2
(45) Date of Patent: May 26, 2020

(54) ARRAY SUBSTRATE, DISPLAY DEVICE HAVING THE SAME, AND MANUFACTURING METHOD THEREOF

(71) Applicant: BOE TECHNOLOGY GROUP CO., LTD., Beijing (CN)

(72) Inventor: Ming Hung Hsu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 40 days.

(21) Appl. No.: 15/863,867

(22) Filed: Jan. 6, 2018

(65) Prior Publication Data

US 2018/0130852 A1 May 10, 2018

Related U.S. Application Data

(62) Division of application No. 15/107,673, filed as application No. PCT/CN2015/099241 on Dec. 28, 2015, now abandoned.

(30) Foreign Application Priority Data

Jun. 12, 2015 (CN) .......................... 2015 1 0324123

(51) Int. Cl.
*H01L 27/32* (2006.01)
*H01L 51/50* (2006.01)
*H01L 51/52* (2006.01)

(52) U.S. Cl.
CPC ...... *H01L 27/3211* (2013.01); *H01L 27/3204* (2013.01); *H01L 27/3206* (2013.01);
(Continued)

(58) Field of Classification Search
CPC ............. H01L 27/3204; H01L 27/3206; H01L 27/3209; H01L 51/504; H01L 51/5262;
(Continued)

(56) References Cited

U.S. PATENT DOCUMENTS

2005/0073228 A1   4/2005   Tyan et al.
2005/0280364 A1  12/2005   Omura et al.
(Continued)

FOREIGN PATENT DOCUMENTS

CN     1864283 A     11/2006
CN   101013745 A      8/2007
(Continued)

OTHER PUBLICATIONS

International Search Report & Written Opinion dated Apr. 6, 2016, regarding PCT/CN2015/09924.

(Continued)

*Primary Examiner* — M. A. Golub-Miller
(74) *Attorney, Agent, or Firm* — Intellectual Valley Law, P.C.

(57) ABSTRACT

The present application discloses an array substrate. The array substrate includes a sub-pixel having a first light emitting area and a second light emitting area structurally different from the first light emitting area. The sub-pixel includes a first electrode on a base substrate; a first light emitting layer in the first light emitting area and a second light emitting layer in the second light emitting area, the first light emitting layer and the second light emitting layer made of a same material and on a side of the first electrode distal to the base substrate; and a first tuning layer between the first light emitting layer and the first electrode in the first light emitting area.

9 Claims, 5 Drawing Sheets

(52) U.S. Cl.
CPC ........ *H01L 27/326* (2013.01); *H01L 27/3209* (2013.01); *H01L 27/3246* (2013.01); *H01L 51/504* (2013.01); *H01L 51/5262* (2013.01); *H01L 51/5265* (2013.01); *H01L 2227/32* (2013.01); *H01L 2251/558* (2013.01)

(58) Field of Classification Search
CPC ............. H01L 27/3211; H01L 2227/32; H01L 2251/558; H01L 51/5265; H01L 27/3246; H01L 27/326
See application file for complete search history.

(56) References Cited

U.S. PATENT DOCUMENTS

| | | | |
|---|---|---|---|
| 2006/0171137 | A1 | 8/2006 | Tamaki |
| 2006/0192220 | A1 | 8/2006 | Nishikawa et al. |
| 2007/0001587 | A1 | 1/2007 | Hatwar et al. |
| 2007/0200492 | A1 | 8/2007 | Cok et al. |
| 2008/0143649 | A1 | 6/2008 | Asaki et al. |
| 2008/0248240 | A1 | 10/2008 | Shi et al. |
| 2009/0072693 | A1 | 3/2009 | Cok et al. |
| 2009/0212687 | A1 | 8/2009 | Cok |
| 2009/0212692 | A1 | 8/2009 | Hasegawa |
| 2010/0315449 | A1 | 12/2010 | Chaji et al. |
| 2010/0327263 | A1 | 12/2010 | Lin et al. |
| 2011/0095279 | A1 | 4/2011 | Mizuno et al. |
| 2012/0126252 | A1 | 5/2012 | Hermers et al. |
| 2012/0235126 | A1 | 9/2012 | Yamazaki |
| 2014/0284576 | A1 | 9/2014 | Sugisawa et al. |
| 2014/0326983 | A1 | 11/2014 | Yamazaki et al. |
| 2014/0339514 | A1* | 11/2014 | Oh ................... H01L 51/5209 257/40 |
| 2016/0284766 | A1* | 9/2016 | Wang ................ H01L 27/3218 |

FOREIGN PATENT DOCUMENTS

| | | |
|---|---|---|
| CN | 101425529 A | 5/2009 |
| CN | 101521262 A | 9/2009 |
| CN | 101673809 A | 3/2010 |
| CN | 101821851 A | 9/2010 |
| CN | 101923828 B | 12/2010 |
| CN | 103441136 A | 12/2013 |
| CN | 103715358 A | 4/2014 |
| CN | 103887316 A | 6/2014 |
| JP | 2006032327 A | 2/2006 |
| JP | 2006236947 A | 9/2006 |
| JP | 2006236974 A | 9/2006 |
| JP | 2010040523 A | 2/2010 |
| JP | 2010062067 A | 3/2010 |
| JP | 2010108706 A | 5/2010 |
| JP | 2010539653 A | 12/2010 |
| JP | 2012123987 A | 6/2012 |
| JP | 2014183025 A | 9/2014 |
| KR | 20100080801 A | 7/2010 |
| KR | 20120028871 A | 3/2012 |
| WO | 2008060348 A1 | 5/2008 |
| WO | 2013073670 A1 | 4/2015 |

OTHER PUBLICATIONS

First Office Action in the Chinese Patent Application No. 201510324123.5, dated Jul. 6, 2017; English translation attached.
Second Office Action in the Chinese Patent Application No. 201510324123.5, dated Sep. 6, 2017; English translation attached.
Notification to Grant Patent Right for Invention in the Chinese Patent Application No. 201510324123.5, dated Jan. 4, 2018; English translation attached.
Restriction Requirement in the U.S. Appl. No. 15/107,673, dated May 18, 2017.
Response to Restriction Requirement in the U.S. Appl. No. 15/107,673, dated May 24, 2017.
Non-Final Rejection in the U.S. Appl. No. 15/107,673, dated Jun. 16, 2017.
Response to Non-Final Rejection in the U.S. Appl. No. 15/107,673, dated Aug. 1, 2017.
Final Office Action in the U.S. Appl. No. 15/107,673, dated Oct. 6, 2017.
Response to Final Office Action in the U.S. Appl. No. 15/107,673, dated Nov. 29, 2017.
Notification of Reason for Refusal in the Korean Patent Application No. 20167033145, dated Dec. 19, 2017; English translation attached.
Notice of Allowance in the Korean Patent Application No. 20167033145, dated Jun. 28, 2018; English translation attached.
First Office Action in the Japanese Patent Application No. 2016570953, dated May 7, 2019; English translation attached.
Extended European search report in the European Patent Application No. 15871294.3, dated Dec. 10, 2018.
Second Office Action in the Japanese Patent Application No. 2016570953, dated Jan. 6, 2020; English translation attached.

* cited by examiner

| Forming a first electrode 10 on a base substrate 2. |

| Forming a first light emitting layer 11 in the first light emitting area 1 and a second light emitting layer 21 in the second light emitting area 2 on a side of the first electrode 10 distal to the base substrate 3, the second light emitting layer 21 made of a same material as the first light emitting layer 11. |

| Forming a first tuning layer 12 between the first light emitting layer 11 and the first electrode 10 in the first light emitting area 1. |

ARRAY SUBSTRATE, DISPLAY DEVICE HAVING THE SAME, AND MANUFACTURING METHOD THEREOF

CROSS-REFERENCE TO RELATED APPLICATION

This application is a divisional of U.S. application Ser. No. 15/107,673, filed Dec. 28, 2015, which is a national stage application under 35 U.S.C. § 371 of International Application No. PCT/CN2015/099241 filed Dec. 28, 2015, which claims priority to Chinese Patent Application No. 201510324123.5, filed Jun. 12, 2015. Each of the forgoing applications is herein incorporated by reference in its entirety for all purposes.

FIELD

The present invention relates to display technology, more particularly, to an array substrate, a display device having the same, and a method of manufacturing thereof.

BACKGROUND

Tandem white organic light emitting displays (OLED) are becoming more mainstream due to their high light emitting efficiency. Manufacturing of tandem OLED does not require fine metal mask (FMM) or other complicated patterning process, making it easy to manufacture full-color, large area displays. In recent years, tandem OLED has found a wide range of applications in display technology, and has become a focus of research and development.

SUMMARY

In one aspect, the present invention provides an array substrate comprising a sub-pixel having a first light emitting area and a second light emitting area structurally different from the first light emitting area. The sub-pixel comprises a first electrode on a base substrate; a first light emitting layer in the first light emitting area and a second light emitting layer in the second light emitting area, the first light emitting layer and the second light emitting layer made of a same material and on a side of the first electrode distal to the base substrate; and a first tuning layer between the first light emitting layer and the first electrode in the first light emitting area.

Optionally, the first light emitting area and the second light emitting area have a layered ring structure comprising a central second light emitting sub-area alternately surrounded by N first light emitting sub-areas and M second light emitting sub-areas, N is an integer≥1, M equals to N or N−1.

Optionally, N=1, M=0. Optionally, N=1, M=1.

Optionally, the sub-pixel further comprises a first hole injection layer on a side of the first light emitting layer proximal to the base substrate in the N first light emitting sub-areas, and a second hole injection layer on a side of the second light emitting layer proximal to the base substrate in the central second light emitting sub-area and the M second light emitting sub-areas.

Optionally, the first hole injection layer is in contact with the first tuning layer.

Optionally, the second hole injection layer is in contact with the first electrode.

Optionally, the first hole injection layer and the second hole injection layer are integrally formed as a single body.

Optionally, the first light emitting area comprises at least one first light emitting sub-area; the second light emitting area comprises at least one second light emitting sub-area; and the at least one first light emitting sub-area and the at least one second light emitting sub-area are in an alternate pattern, each of the at least one first light emitting sub-area is adjacent to the at least one second light emitting sub-area, each of the at least one second light emitting sub-area is adjacent to the at least one first light emitting sub-area.

Optionally, the first light emitting layer comprises a plurality of first light emitting sub-layers connected in series, and the second light emitting layer comprises a plurality of second light emitting sub-layers connected in series.

Optionally, the sub-pixel further comprises a pixel defining layer between the first light emitting area and the second light emitting area.

Optionally, the sub-pixel further comprises a second tuning layer between the second light emitting layer and the first electrode in the second light emitting area; wherein the second tuning layer has a property different from the first tuning layer.

Optionally, the second tuning layer is made of a material different from that of the first tuning layer.

Optionally, the second tuning layer has a thickness different from that of the first tuning layer.

Optionally, the first tuning layer is thicker than the second tuning layer by around 25 nm to around 40 nm.

Optionally, the first tuning layer has a thickness between around 25 nm to around 40 nm.

Optionally, the sub-pixel further comprises a first hole injection layer on a side of the first light emitting layer proximal to the base substrate in the first light emitting area, and a second hole injection layer on a side of the second light emitting layer proximal to the base substrate in the second light emitting area.

Optionally, a ratio between an aperture ratio in the first light emitting area and an aperture ratio in the second light emitting area correlates with a difference in turn-on voltages between the first light emitting area and the second light emitting area.

In another aspect, the present invention provides a method of manufacturing an array substrate comprising a sub-pixel having a first light emitting area and a second light emitting area structurally different from the first light emitting area, comprising forming a first electrode on a base substrate; forming a first light emitting layer in the first light emitting area and a second light emitting layer in the second light emitting area on a side of the first electrode distal to the base substrate; the second light emitting layer made of a same material as the first light emitting layer; and forming a first tuning layer between the first light emitting layer and the first electrode in the first light emitting area.

Optionally, the method further comprises forming a second tuning layer between the second light emitting layer and the first electrode in the second light emitting area; wherein the second tuning layer has a property different from the first tuning layer.

Optionally, the method further comprises forming a first hole injection layer on a side of the first light emitting layer proximal to the base substrate in the first light emitting area, and forming a second hole injection layer on a side of the second light emitting layer proximal to the base substrate in the second light emitting area.

Optionally, the first light emitting layer and the second light emitting layer are formed in a single process using a same material.

In another aspect, the present invention provides a display device comprising an array substrate described herein or manufactured by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Several problems associated with tandem organic light emitting display devices have been identified in the present disclosure. The first problem is the carrier balance issue associated with a device having multiple light emitting units connected in series. In such a device, the position of an electron-hole recombination zone shifts with a variation in emission intensity, resulting in color shift associated with emission intensity. Secondly, it is difficult to optimize emission conditions for multiple light emitting materials in a same micro-cavity structure in a same device, particularly in a wide-viewing angle display device. Consequently, color shift may occur when a display device is viewed at different angles.

In one aspect, the present disclosure provides a superior array substrate and a display device having the same with much reduced color shift associated with emission intensity and color shift associated with viewing angles, and a manufacturing method thereof.

In some embodiments, the present disclosure provides an array substrate including a sub-pixel having a first light emitting area and a second light emitting area structurally different from the first light emitting area. In some embodiments, the sub-pixel includes a first electrode on a base substrate, a first light emitting layer in the first light emitting area and a second light emitting layer in the second light emitting area, the first light emitting layer and the second light emitting layer made of a same material and on a side of the first electrode distal to the base substrate, and a first tuning layer between the first light emitting layer and the first electrode in the first light emitting area for tuning optoelectronic properties of the first light emitting area. The tuning layer may be made of a transparent semiconductor material or a transparent conductive material. Examples of tuning layer materials include, but are not limited to, indium tin oxide, silicon oxide (SiOx), silicon nitride (SiNx), and poly(3,4-ethylenedioxythiophene) polystyrene sulfonate (PEDOT:PSS). Optionally, the first tuning layer is adjacent to the first electrode. Optionally, the first tuning layer is adjacent to the first light emitting layer.

In some embodiments, the first light emitting layer may be a first organic light emitting layer. In some embodiments, the second light emitting layer may be a second organic light emitting layer. The light emitting layers may include a plurality of sub-layers.

In some embodiments, the sub-pixel further includes a second electrode on a side of the first light emitting layer and the second light emitting layer distal to the base substrate.

In some embodiments, the first light emitting layer and the second light emitting layer are a same layer. For example, first light emitting layer and the second light emitting layer are formed in a single process and are made of a same material. In some embodiments, the first light emitting layer and the second light emitting layer are formed in different processes.

In some embodiments, the sub-pixel further includes a second tuning layer between the second light emitting layer and the first electrode in the second light emitting area. The second tuning layer has a property different from the first tuning layer. For example, the second tuning layer may be made of a material different from that of the first tuning layer, or made of a process different from that of the first tuning layer. Optionally, the second tuning layer may have a thickness different from that of the first tuning layer. Optionally, the first tuning layer is thicker than the second tuning layer by around 25 nm to around 40 nm. Optionally, the second tuning layer is adjacent to the first electrode. Optionally, the second tuning layer is adjacent to the second light emitting layer.

In some embodiments, the sub-pixel further includes a first hole injection layer on a side of the first light emitting layer proximal to the base substrate in the first light emitting area, and a second hole injection layer on a side of the second light emitting layer proximal to the base substrate in the second light emitting area. Optionally, the first hole injection layer and the second hole injection layer are integrally formed as a single body.

In some embodiments, the sub-pixel does not have a second tuning layer between the second light emitting layer and the first electrode in the second light emitting area. For example, the second light emitting layer is in contact with the first electrode in the second light emitting area whereas the first light emitting layer is in contact with the first tuning layer in the first light emitting area. When the sub-pixel includes hole injection layers, the second hole injection layer is in contact with the first electrode in the second light emitting area whereas the first hole injection layer is in contact with the first tuning layer in the first light emitting area. Optionally, when the sub-pixel does not have a second tuning layer between the second light emitting layer and the first electrode in the second light emitting area, the first tuning layer has a thickness between around 25 nm to around 40 nm.

Figure 1:
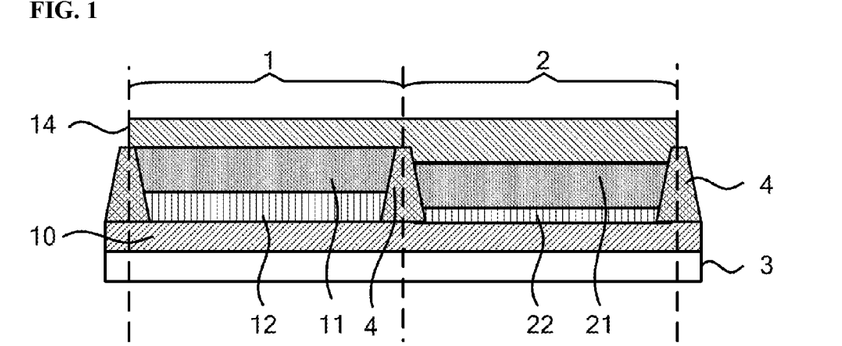
FIG. 1 is a diagram illustrating the structure of an array substrate according to certain embodiments.

FIG. 1 is a diagram illustrating the structure of an array substrate according to certain embodiments. Referring to FIG. 1, the array substrate in the embodiment has a sub-pixel, e.g., on the base substrate 3. The sub-pixel has a first light emitting area 1 and a second light emitting area 2. The sub-pixel includes a first electrode 10 on the base substrate 3, and a second electrode 14. In the embodiment, the first light emitting area 1 and the second light emitting area 2 have a same first electrode 10 and a same second electrode 14.

The sub-pixel in the embodiment further includes a first light emitting layer 11 and a second light emitting layer 21 made of a same material. The first light emitting layer 11 and the second light emitting layer 21 may be, e.g., organic light emitting layers. The first light emitting layer 11 may include a plurality of first light emitting sub-layers connected in series. The second light emitting layer 21 may include a plurality of second light emitting sub-layers connected in series. For example, the light emitting layers may emit white light generated by a combination of light produced by a plurality of sub-layers. Optionally, the first and/or second light emitting layer may have only one light emitting sub-layer for emitting light.

The sub-pixel in the embodiment further includes a first tuning layer 12 between the first light emitting layer 11 and the first electrode 10 in the first light emitting area 1 and a second tuning layer 22 between the second light emitting layer 21 and the first electrode 10 in the second light emitting area 2. The second tuning layer 22 has a property (e.g., an optoelectronic property) different from the first tuning layer 12. Optionally, the first tuning layer is thicker than the second tuning layer by around 25 nm to around 40 nm.

Optionally, the sub-pixel does not have a second tuning layer 22 between the second light emitting layer and the first electrode in the second light emitting area. For example, the second light emitting layer 21 is in direct contact with the first electrode 10 in the second light emitting area 2 whereas the first light emitting layer 11 is in direct contact with the first tuning layer 12 in the first light emitting area 1. When the sub-pixel includes hole injection layers, the second hole injection layer is in direct contact with the first electrode 10 in the second light emitting area 2 whereas the first hole injection layer is in direct contact with the first tuning layer 12 in the first light emitting area 1. Optionally, when the sub-pixel does not have a second tuning layer 22 between the second light emitting layer 21 and the first electrode 10 in the second light emitting area 2, the first tuning layer 12 has a thickness between around 25 nm to around 40 nm.

The first electrode 10 may be a cathode or an anode. The second electrode 14 may be a cathode or an anode. For example, in a non-inverted OLED device, the first electrode is the anode and the second electrode is the cathode. In an inverted OLED device, the first electrode is the cathode and the second electrode is the anode.

In some embodiments, the first light emitting area 1 includes at least one first light emitting sub-area, the second light emitting area 2 includes at least one second light emitting sub-area. Optionally, the first light emitting area 1 includes only one first light emitting sub-area. Optionally, the second light emitting area 2 includes only one second light emitting sub-area. Optionally, the first light emitting area 1 includes only one first light emitting sub-area, the second light emitting area 2 includes only one second light emitting sub-area.

In some embodiments, the first light emitting area 1 includes more than one first light emitting sub-area, the second light emitting area 2 includes more than one second light emitting sub-area. Optionally, the first light emitting sub-areas and the second light emitting sub-areas are in an alternate pattern. For example, each first light emitting sub-area is adjacent to the second light emitting sub-area, and each second light emitting sub-area is adjacent to the first light emitting sub-area. The optoelectronic property differences between the first light emitting sub-areas and the second light emitting sub-areas accumulate into the optoelectronic property differences between the first light emitting area 1 and the second light emitting area 2. Various embodiments of alternately arranged sub-areas can be practiced. An array substrate having alternately arranged sub-areas may have optoelectronic properties similar to those of an array substrate having one first light emitting sub-area and one second light emitting sub-area.

FIG. 1 illustrates a sub-pixel of an array substrate having one first light emitting sub-area and one second light emitting sub-area. Referring to FIG. 1, the sub-pixel in the embodiment includes a first light emitting layer 11 on a side of the first electrode 10 distal to the base substrate 3 in the first light emitting area 1 and a second light emitting layer 21 on a side of the first electrode 10 distal to the base substrate 3 in the second light emitting area 2. The first light emitting layer 11 and/or the second light emitting layer 21 may be a single layer or may include a plurality of sub-layers connected in series. The light emitting layers may be organic light emitting layers.

The sub-pixel in the embodiment further includes a first tuning layer 12 between the first light emitting layer 11 and the first electrode 10 in the first light emitting area 1, and a second tuning layer 22 between the second light emitting layer 21 and the first electrode 10 in the second light emitting area 2. The second tuning layer 22 has a property different from the first tuning layer 12, resulting in different optoelectronic properties between the first light emitting area 1 and the second light emitting area 2. For example, the second tuning layer 22 may be made of a material different from that of the first tuning layer 12, or may be made of a process different from that of the first tuning layer 12. Optionally, the second tuning layer 22 may have a thickness different from that of the first tuning layer 12. In some cases, the second tuning layer 22 has a thickness of zero, i.e., the sub-pixel does not have a second tuning layer 22 between the second light emitting layer 21 and the first electrode 10 in the second light emitting area 2.

In some embodiments, one of the different optoelectronic properties is the resistance in the light emitting areas, i.e., the resistance in the first light emitting area 1 is different from the resistance in the second light emitting area 2. The resistance difference may be illustrated using a voltammogram curve (IV curve). Specifically, the difference is in part reflected by the difference in turn-on voltages. Referring to FIG. 1, the first tuning layer 12 in the embodiment is thicker than the second tuning layer 22. This results in a higher turn-on voltage in the first light emitting area 1 as compared to the second light emitting area 2. When a voltage is applied to the first light emitting area 1 and the second light emitting area 2, a voltage in the second light emitting area 2 reaches a level of its turn-on voltage first, and light emits in the second light emitting area 2. Before a voltage in the first light emitting area 1 reaches a level of its turn-on voltage, the first light emitting area 1 does not emit light. With a further increase in voltage, the second light emitting area 2 stably emits light with a high intensity, whereas the first light emitting area 1 begins to emit light with a lower intensity when the voltage in the first light emitting area 1 reaches a level of its turn-on voltage. The color of light emitted by an organic light emitting diode correlates with the emitting intensity. Color biases towards green when the emitted light is of high intensity, and biases towards blue when the intensity is low. Thus, when the first light emitting area 1 begins to emit light (with a lower intensity), the light color biases towards blue in the first light emitting area 1, and biases towards green in the second light emitting area 2. When a sub-pixel (e.g., a red sub-pixel) contains a first light emitting area 1 and a second light emitting area 2, the color shift in the two areas compensates each other, thereby reducing or eliminating color shift in the sub-pixel as a whole. When a pixel contains a first light emitting area 1 and a second light emitting area 2, the color shift in the two areas compensates each other, thereby reducing or eliminating color shift in the pixel as a whole.

Figure 2:
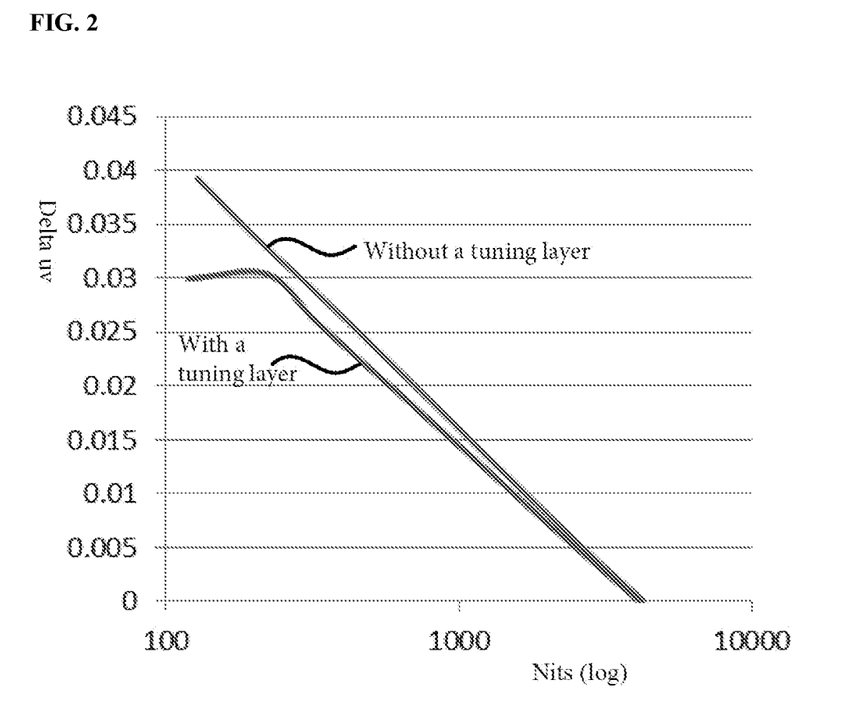
FIG. 2 is a diagram illustrating the change in color coordination according to certain embodiments.

When the first light emitting layer 11 and the second light emitting layer 21 are organic light emitting layers, the depth of the microcavity in each light emitting area is the sum of the thicknesses of the light emitting layer, the tuning layer, and the first electrode in that light emitting area. The microcavity depths in the first light emitting layer 11 and the second light emitting layer 21 are different due to the different thickness of their tuning layers. The microcavity depth difference leads to a decreased CIEu and an increased CIEv in the color coordinates at a small viewing angle (e.g., a zero viewing angle), and an increased CIEu and a decreased CIEv in the color coordinates at a large viewing angle (e.g., a side view at a large viewing angle). As shown in FIG. 2, the color shift associated with viewing angle corresponds to the CIEuv value. $(CIEuv)^2$ can be expressed using the following equation: $((CIEu$ at zero viewing angle$)$ $(CIEu$ at a large viewing angle$))^2+((CIEv$ at zero viewing angle$)$ $(CIEv$ at a large viewing angle$))^2$. In a light emitting area without a tuning layer, the CIEuv value is the maximum value. In a light emitting area with a tuning layer, CIEu at zero viewing angle, CIEu at a large viewing angle, CIEv at zero viewing angle, and CIEv at a large viewing angle can all be changed due to the presence of the tuning layer, resulting in a change in $(CIEuv)^2$ so that $(CIEuv)^2$ value is not at the maximum. For example, it results in a small decrease (e.g., a left or right shift) in $(CIEuv)^2$ value relative to the maximum value. Consequently, this results in a decrease in Δuv, which corresponds to color shift associated with the viewing angle (Table 1).

TABLE 1

CIEx, CIEy, CIEu, CIEv, and Δuv in a sub-pixel with a tuning layer and a sub-pixel without a tuning layer

|  | CIEx | CIEy | CIEu | CIEv | Δuv |
|---|---|---|---|---|---|
| A sub-pixel without a tuning layer |  |  |  |  |  |
| View angle = 0 degree | 0.306 | 0.331 | 0.192 | 0.468 |  |
| View angle = 40 degree | 0.291 | 0.387 | 0.165 | 0.493 | 0.037 |
| A sub-pixel having a tuning layer |  |  |  |  |  |
| View angle = 0 degree | 0.308 | 0.343 | 0.189 | 0.475 |  |
| View angle = 40 degree | 0.294 | 0.378 | 0.170 | 0.489 | 0.024 |

As shown in Table 1, a sub-pixel having a tuning layer results in a decrease of more than 50% in Δuv value at a viewing angle of 40 degree (e.g., a Δuv value change from 0.037 to 0.024). This results in a much reduced color shift associated with viewing angle.

Figure 3:
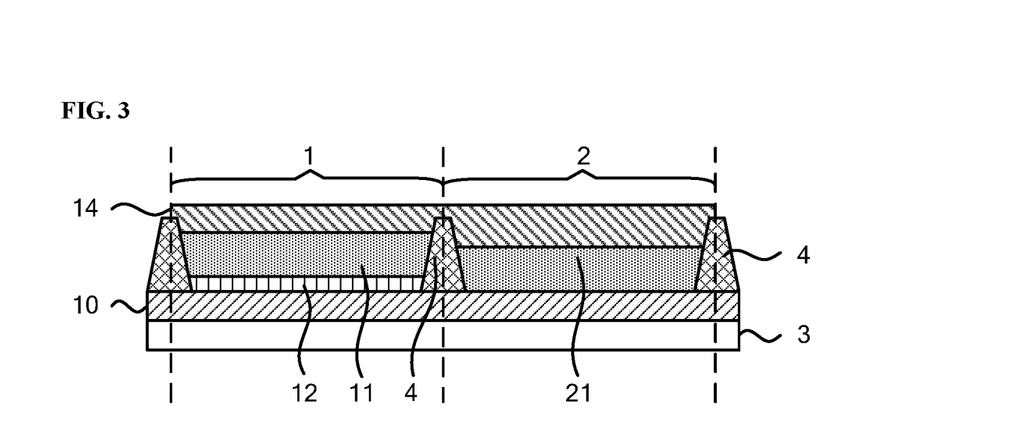
FIG. 3 is a diagram illustrating the structure of an array substrate according to certain embodiments.

In some embodiments, the sub-pixel includes a first tuning layer 12 in the first light emitting area 1, and a second tuning layer 22 in the second light emitting area 2 (FIG. 1). In some embodiments, the sub-pixel includes a first tuning layer 12 in the first light emitting area 1, but not a second tuning layer 22 in the second light emitting area 2 (FIG. 3). In some embodiments, the sub-pixel includes a second tuning layer 22 in the second light emitting area 2, but not a first tuning layer 12 in the first light emitting area 1.

The first light emitting area may be a continuous area or a discontinuous area comprising a plurality of first light emitting sub-areas. Likewise, the second light emitting area may be a continuous area or a discontinuous area comprising a plurality of second light emitting sub-areas. In some embodiments, the first light emitting area and the second light emitting area have a layered ring structure in plan view of the array substrate. For example, the layered ring structure may include a central second light emitting sub-area alternately surrounded by N first light emitting sub-areas and N−1 second light emitting sub-areas, N is an integer≥1.

Figure 9:
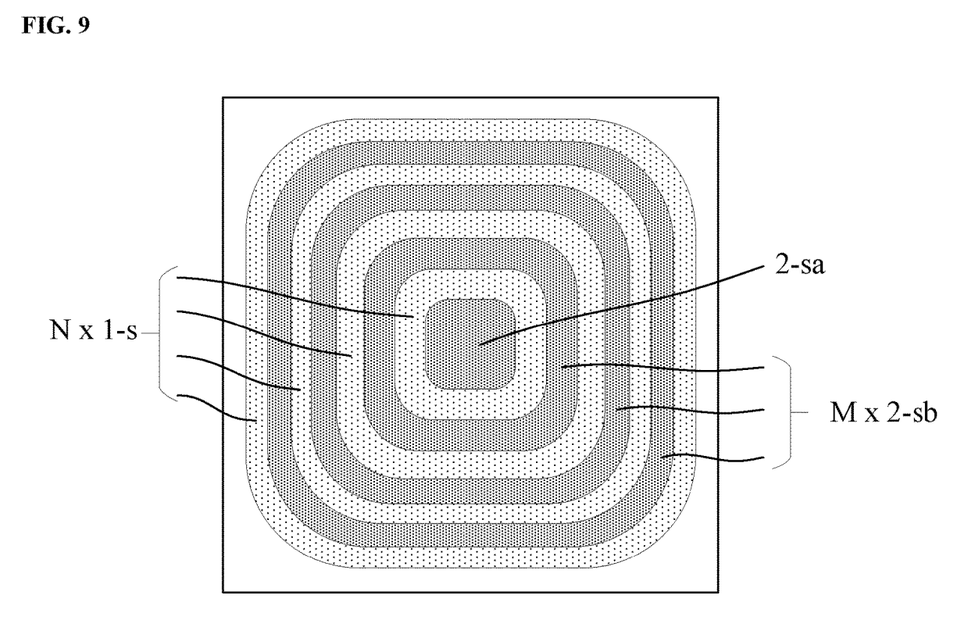
FIG. 9 is a diagram illustrating the structure of an array substrate according to certain embodiments.
Figure 10:
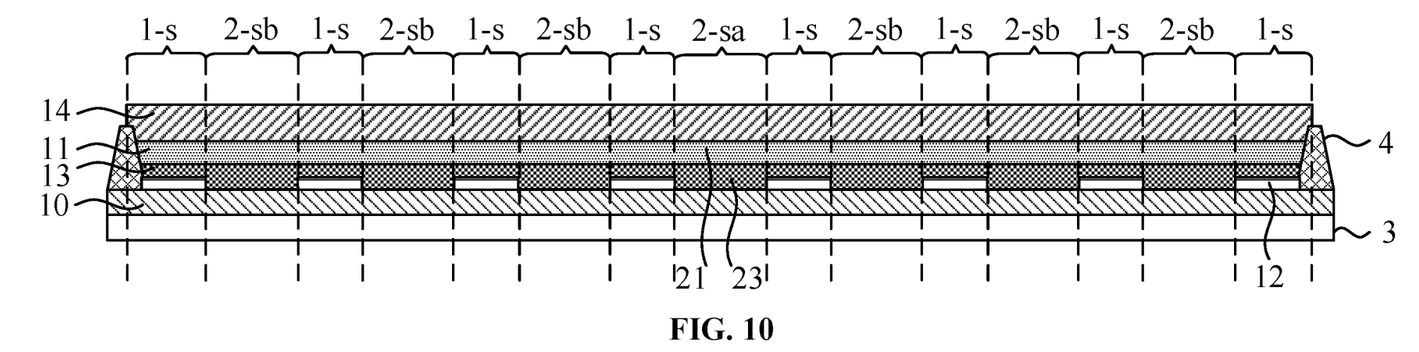
FIG. 10 is a plan view of a sub-pixel according to certain embodiments.

In some embodiments, and referring to FIG. 9 and FIG. 10, the first light emitting area and the second light emitting area have a layered structure (e.g., a layered ring structure) in plan view of the array substrate. For example, the layered ring structure may include a central second light emitting sub-area 2-*sa* alternately surrounded by N first light emitting sub-areas 1*s* and N second light emitting sub-areas 2-*sb*, N is an integer≥1.

As used herein, the term "ring" or "ring structure" refers to a structure or portion of a structure having a hole therethrough. A ring structure may be formed of a square, rectangle, triangle or another shape with a hole therethrough, or may be essentially round like a doughnut. In some embodiments, the ring structure is formed of a square or rectangle shape with a hole therethrough. Optionally, the ring is a square ring. Optionally, the ring is a rectangle ring.

In some embodiments, the sub-pixel further includes a first hole injection layer on a side of the first light emitting layer 11 proximal to the base substrate in the N first light emitting sub-areas, and a second hole injection layer on a side of the second light emitting layer 21 proximal to the base substrate in the central second light emitting sub-area and the N−1 second light emitting sub-areas. Optionally, the first hole injection layer is in contact with the first tuning layer 12. Optionally, the second hole injection layer is in contact with the first electrode 10. Optionally, the first hole injection layer and the second hole injection layer are integrally formed as a single body.

Figure 4:
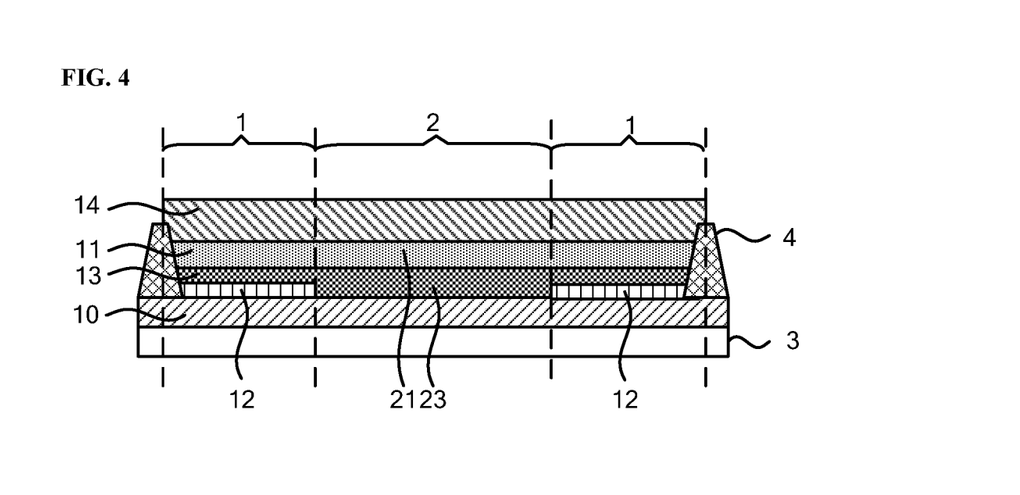
FIG. 4 is a diagram illustrating the structure of an array substrate according to certain embodiments.
Figure 5:
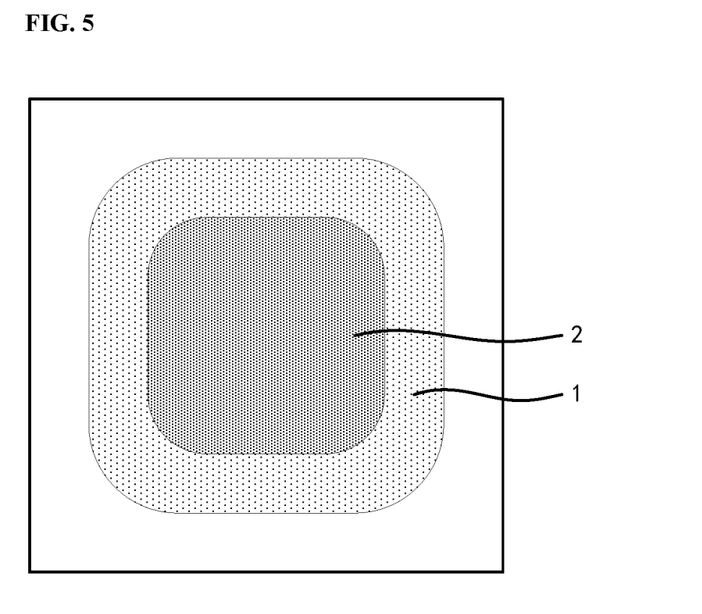
FIG. 5 is a plan view of a sub-pixel according to certain embodiments.

FIGS. 4 and 5 show a plan view of certain sub-pixels according to certain embodiments. Referring to FIGS. 4 and 5, the first light emitting area and the second light emitting area have a layered ring structure (in plan view of the array substrate) having a central second light emitting area 2 surrounded by one first light emitting area 1. The sub-pixel includes a first hole injection layer 13, and a second hole injection layer 23. The first hole injection layer on a side of the first light emitting layer 11 proximal to the base substrate 3 in the first light emitting area 1, and is in contact with the first tuning layer 12. When a sub-pixel or a pixel includes such a layered ring structure, optionally the central area (e.g., the central second light emitting area 2) has a higher emitted light intensity. Optionally, the peripheral area (e.g., the first light emitting area 1) has a tuning layer (e.g., the first tuning layer 12), and the central area (e.g., the second light emitting area 2) does not have a tuning layer. The second hole injection layer 23 is in direct contact with the first electrode 10. In such a design, the central area has a higher light transmission rate. The first electrode 10 may better attract electrons from the second hole injection layer 23 to produce holes. Consequently, the light intensity in the central area is higher as compared to the peripheral area.

As shown in FIGS. 4 and 5, the first hole injection layer 13 and the second hole injection layer 23 may be integrally formed as a single body, and may be formed in a single process, thereby simplifies manufacturing process.

Optionally, the first light emitting layer 11 includes a plurality of first light emitting sub-layers connected in series. Optionally, the second light emitting layer 21 includes a plurality of second light emitting sub-layers connected in series.

FIG. 9 is a diagram illustrating the structure of an array substrate according to certain embodiments. FIG. 10 is a plan view of a sub-pixel according to certain embodiments. Referring to FIG. 9 and FIG. 10, the first light emitting area and the second light emitting area have a layered ring structure (in plan view of the array substrate). The layer structure includes a central second light emitting sub-area 2-sa alternately surrounded by N first light emitting sub-areas 1-s and M second light emitting sub-areas 2-sb. The N first light emitting sub-areas 1-s and the M second light emitting sub-areas 2-sb are in an alternate pattern, each of the N first light emitting sub-areas 1-s is adjacent to at least one of the M second light emitting sub-areas 2-sb, each of the M second light emitting sub-areas 2-sb is adjacent to at least one of the N first light emitting sub-areas 1-s. Optionally, N is an integer≥1. Optionally, N is an integer>1. Optionally, M equals to N or N−1. Optionally, M is an integer>0. Optionally, N is an integer>1, M equals to N or N−1, and M>0.

Figure 6:
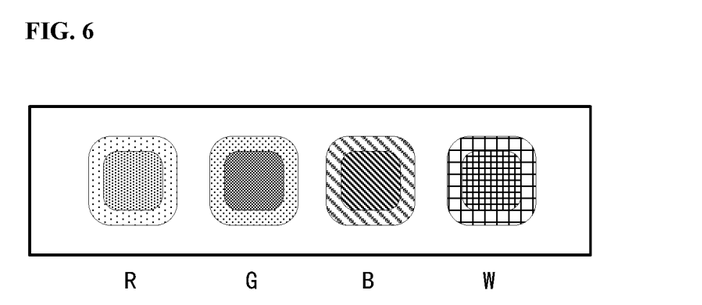
FIG. 6 is a plan view of a pixel according to certain embodiments.

FIG. 6 is a plan view of a pixel according to certain embodiments. Referring to FIG. 6, the sub-pixel may be a red sub-pixel, a green sub-pixel, a blue sub-pixel, or a white sub-pixel. In some cases, the array substrate has a plurality of pixels, each of which includes a red sub-pixel, a green sub-pixel, a blue sub-pixel, and the white sub-pixel. Optionally, the sub-pixel is a white sub-pixel. The white sub-pixel may enhance the light intensity of a pixel.

Figure 7:
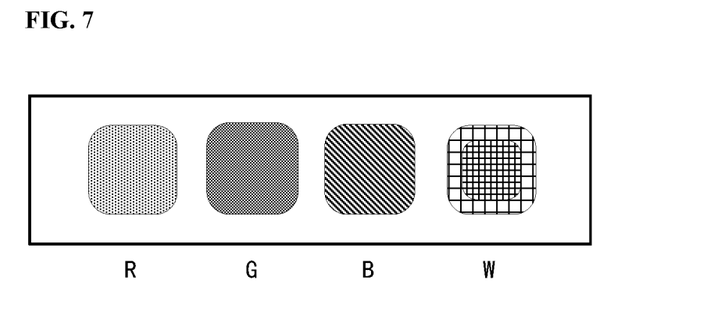
FIG. 7 is a plan view of a pixel according to certain embodiments.

FIG. 7 is a plan view of a pixel according to certain embodiments. Referring to FIG. 7, the array substrate includes a plurality of pixels. The pixel in the embodiment includes a red sub-pixel, a green sub-pixel, a blue sub-pixel, and a white sub-pixel. The white sub-pixel in the embodiment (but not other sub-pixels) includes the first tuning layer 12 and/or the second tuning layer 22. In an organic light emitting diode, the white sub-pixel has the most effects on both the color shift associated with the light intensity and the color shift associated with the viewing angle as compared to R, G, and B sub-pixels. Optionally, the array substrate may include a tuning layer only in the white sub-pixels to simplify manufacturing process.

Optionally, the sub-pixel further includes a pixel defining layer 4 between the first light emitting area 1 and the second light emitting area 2.

When the sub-pixel includes both a first tuning layer 12 and a second tuning layer 22, the second tuning layer 22 has a property different from the first tuning layer 12. For example, the second tuning layer may be made of a material different from that of the first tuning layer, or made of a process different from that of the first tuning layer. Optionally, the second tuning layer may have a thickness different from that of the first tuning layer. Optionally, the first tuning layer is thicker than the second tuning layer by around 25 nm to around 40 nm. In some array substrates, one tuning layer (e.g., the first tuning layer 12) may be made of indium gallium oxide, and the other tuning layer (e.g., the second tuning layer 22) may be made of indium zinc oxide. Similarly, one tuning layer may be formed by in-jet printing, and the other may be formed by coating glue. The first tuning layer 12 and the second tuning layer 22 so made have different optoelectronic properties, leading to different optoelectronic properties of the first light emitting area 1 and the second light emitting area 2.

Optionally, the first tuning layer 12 and/or the second tuning layer 22 may be made of a transparent semiconductor material or a transparent conductive material.

Optionally, when the sub-pixel includes both a first tuning layer 12 and a second tuning layer 22, the first tuning layer is thicker than the second tuning layer by around 25 nm to around 40 nm. Optionally, when the sub-pixel only includes a tuning layer in one of the first light emitting area 1 and the second light emitting area 2, the sole tuning layer (e.g., the first tuning layer) has a thickness between around 25 nm to around 40 nm.

In some embodiments, a ratio between an aperture ratio in the first light emitting area 1 and an aperture ratio in the second light emitting area 2 correlates with a difference in turn-on voltages between the first light emitting area 1 and the second light emitting area 2. Specifically, a thicker tuning layer typically results in a higher turn-on voltage (e.g., particularly when the material for the tuning layers are the same). For example, if the first tuning layer 12 is thicker than the second tuning layer 22, then the turn-on voltage for the first light emitting area 1 is higher than that of the second light emitting area 2. In some cases, the turn-on voltage difference is 1 V, and the ratio of the respective aperture ratios is 4:6. The ratio of the respective aperture ratios correlates with the difference in thickness. Based on this correlation, the difference in turn-on voltages may be conveniently determined by detecting the respective aperture ratios in the first and the second light emitting areas. The color shift in respective light emitting area may be rapidly and accurately determined.

Figure 8:
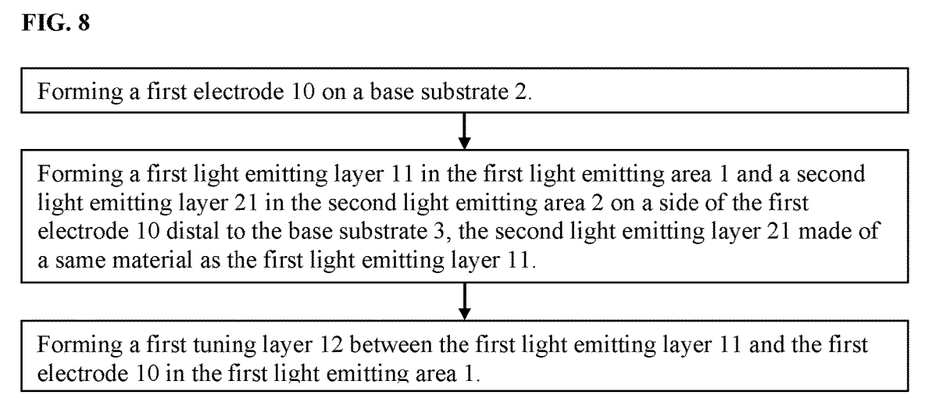
FIG. 8 is a flow chart illustrating a method of manufacturing an array substrate according to certain embodiments.

FIG. 8 is a flow chart illustrating a method of manufacturing an array substrate according to certain embodiments. The array substrate in the embodiment includes a sub-pixel having a first light emitting area 1 and a second light emitting area 2 structurally different from the first light emitting area 1. Referring to FIG. 8, the method in the embodiment includes forming a first electrode 10 on a base substrate 3; forming a first light emitting layer 11 in the first light emitting area 1 and a second light emitting layer 21 in the second light emitting area 2 on a side of the first electrode 10 distal to the base substrate 3, the second light emitting layer 21 made of a same material as the first light emitting layer 11; and forming a first tuning layer 12 between the first light emitting layer 11 and the first electrode 10 in the first light emitting area 1.

Optionally, the first light emitting layer 11 and the second light emitting layer 21 may be formed in a single process using a same material. Optionally, the first light emitting layer 11 and the second light emitting layer 21 may be formed in separate processes and using a same material.

The method described herein may use any appropriate techniques. For example, layers can be formed by vapor deposition or sputtering. The various components may be patterned by, e.g., an etching process.

In another aspect, the present disclosure also provides a display device having an array substrate described herein or manufactured by a method described herein. Examples of display devices include, but are not limited to, an electronic paper, a mobile phone, a tablet computer, a television, a notebook computer, a digital album, a gps, etc.

Based on the above, the present disclosure provides an array substrate including a sub-pixel having a first light emitting area and a second light emitting area structurally different from the first light emitting area. The first light emitting area and the second light emitting area have different optoelectronic properties, resulting in different turn-on voltages in different light emitting areas. The color bias in each light emitting area resulting from different turn-on voltages compensates each other, thereby reducing color shift associated with emitted light intensity. Differences in the first light emitting area and the second light emitting area also result in different microcavity depths in these areas, reducing color shift associated with viewing angle.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate comprising a sub-pixel having a first light emitting area and a second light emitting area structurally different from the first light emitting area, wherein the sub-pixel comprising:

a first electrode on a base substrate;

a first light emitting layer in the first light emitting area and a second light emitting layer in the second light emitting area, the first light emitting layer and the second light emitting layer made of a same material and on a side of the first electrode distal to the base substrate; and a first tuning layer between the first light emitting layer and the first electrode in the first light emitting area;

wherein the first light emitting area comprises N first light emitting sub-areas and the second light emitting area comprises a central second light emitting sub-area and M second light emitting sub-areas;

the central second light emitting sub-area is alternately surrounded by the N first light emitting sub-areas and the M second light emitting sub-areas, N is an integer>1, M equals to N or N−1, and M>0;

each of the N first light emitting sub-areas has a ring shape, each of the M second light emitting sub-areas has a ring shape, the N first light emitting sub-areas and the M second light emitting sub-areas together form a layered ring structure in the sub-pixel; and the N first light emitting sub-areas and the M second light emitting sub-areas are in an alternate pattern, each of the N first light emitting sub-areas is adjacent to at least one of the M second light emitting sub-areas, each of the M second light emitting sub-areas is adjacent to at least one of the N first light emitting sub-areas;

wherein the sub-pixel further comprises:

a first hole injection layer on a side of the first light emitting layer proximal to the base substrate in the N first light emitting sub-areas; and a second hole injection layer on a side of the second light emitting layer proximal to the base substrate in the central second light emitting sub-area and the M second light emitting sub-areas;

wherein the first hole injection layer is in contact with the first tuning layer;

the second hole injection layer and the first electrode are in direct contact with each other, and are connected without any intermediary element at an interface between the second hole injection layer and the first electrode;

the first hole injection layer and the second hole injection layer are integrally formed as a single body, and are made of a same hole injection material;

the first hole injection layer and the first tuning layer are in direct contact with each other, and are connected without any intermediary element at an interface between the first hole injection layer and the first tuning layer;

the first tuning layer is made of a material different from a material of the first hole injection layer and the second hole injection layer; and the first tuning layer is made of a material selected from a group consisting of indium tin oxide, silicon oxide (SiOx), silicon nitride (SiNx), and poly(3,4-ethylenedioxythiophene) polystyrene sulfonate (PEDOT:PSS).

2. The array substrate of claim 1, wherein a tuning layer is absent between the second light emitting layer and the first electrode in the second light emitting area.

3. The array substrate of claim 2, wherein the central second light emitting area has a higher emitted light intensity than the first light emitting area.

4. The array substrate of claim 1, wherein the first light emitting layer comprises a plurality of first light emitting sub-layers connected in series, and the second light emitting layer comprises a plurality of second light emitting sub-layers connected in series.

5. The array substrate of claim 1, wherein the first tuning layer has a thickness between 25 nm to 40 nm.

6. The array substrate of claim 1, wherein a ratio between an aperture ratio in the first light emitting area and an aperture ratio in the second light emitting area correlates with a difference in turn-on voltages between the first light emitting area and the second light emitting area.

7. A display device comprising an array substrate of claim 1.

8. A method of manufacturing an array substrate comprising a sub-pixel having a first light emitting area and a second light emitting area structurally different from the first light emitting area, comprising:

forming a first electrode on a base substrate;

forming a first light emitting layer in the first light emitting area and a second light emitting layer in the second light emitting area on a side of the first electrode distal to the base substrate; the second light emitting layer made of a same material as the first light emitting layer; and forming a first tuning layer between the first light emitting layer and the first electrode in the first light emitting area;

wherein the first light emitting area is formed to comprise N first light emitting sub-areas and the second light emitting area is formed to comprise a central second light emitting sub-area and M second light emitting sub-areas;

the central second light emitting sub-area alternately surrounded by the N first light emitting sub-areas and the M second light emitting sub-areas, N is an integer>1, M equals to N or N−1, and M>0;

each of the N first light emitting sub-areas has a ring shape, each of the M second light emitting sub-areas has a ring shape, the N first light emitting sub-areas and the M second light emitting sub-areas together form a layered ring structure in the sub-pixel; and the N first light emitting sub-areas and the M second light emitting sub-areas are formed in an alternate pattern, each of the N first light emitting sub-areas is adjacent to at least one of the M second light emitting sub-areas, each of the M second light emitting sub-areas is adjacent to at least one of the N first light emitting sub-areas;

wherein the method further comprises:

forming a first hole injection layer on a side of the first light emitting layer proximal to the base substrate in the N first light emitting sub-areas; and forming a second hole injection layer on a side of the second light emitting layer proximal to the base substrate in the central second light emitting sub-area and the M second light emitting sub-areas;

wherein the first hole injection layer is formed to be in contact with the first tuning layer;

the second hole injection layer and the first electrode are formed to be in direct contact with each other, and are connected without any intermediary element at an interface between the second hole injection layer and the first electrode;

the first hole injection layer and the second hole injection layer are integrally formed as a single body, and are made of a same hole injection material;

the first hole injection layer and the first tuning layer are formed to be in direct contact with each other, and are connected without any intermediary element at an interface between the first hole injection layer and the first tuning layer;

the first tuning layer is made of a material different from a material of the first hole injection layer and the second hole injection layer; and the first tuning layer is made of a material selected from a group consisting of indium tin oxide, silicon oxide (SiOx), silicon nitride (SiNx), and poly(3,4-ethylenedioxythiophene) polystyrene sulfonate (PEDOT:PSS).

9. The method of claim 8, wherein the first light emitting layer and the second light emitting layer are formed in a single process using a same material.

* * * * *